US005585735A

United States Patent [19]
Takahashi et al.

[11] Patent Number: 5,585,735
[45] Date of Patent: Dec. 17, 1996

[54] E-O PROBE WITH FOP AND VOLTAGE DETECTING APPARATUS USING THE E-O PROBE

[75] Inventors: Hironori Takahashi; Teruo Hiruma, both of Hamamatsu, Japan

[73] Assignee: Hamamatsu Photonics K.K., Hamamatsu, Japan

[21] Appl. No.: 368,812

[22] Filed: Jan. 6, 1995

[30] Foreign Application Priority Data

Jan. 12, 1994 [JP] Japan .................................. 6-001622
Dec. 5, 1994 [JP] Japan .................................. 6-300942

[51] Int. Cl.$^6$ .......................... G01R 31/28; G01R 19/00; G02B 6/22; G02F 1/03
[52] U.S. Cl. ........................... 324/753; 324/96; 359/257; 385/126
[58] Field of Search ......................... 324/753, 96, 158.1; 359/245, 257, 259

[56] References Cited

U.S. PATENT DOCUMENTS

| | | | |
|---|---|---|---|
| 4,247,165 | 1/1981 | Versluis | 385/120 |
| 4,864,220 | 9/1989 | Aoshima et al. | 324/96 |
| 4,891,579 | 1/1990 | Aoshima et al. | 324/96 |
| 4,906,922 | 3/1990 | Takahashi et al. | 324/753 |
| 5,034,683 | 7/1991 | Takahashi et al. | 324/753 |
| 5,124,635 | 6/1992 | Henley | 324/96 |
| 5,157,327 | 10/1992 | Henley | 324/753 |
| 5,272,434 | 12/1993 | Meyrueix et al. | 324/753 |
| 5,391,985 | 2/1995 | Henley | 324/158.1 |

FOREIGN PATENT DOCUMENTS

| | | |
|---|---|---|
| 0299432 | 1/1989 | European Pat. Off. . |
| 0297562 | 1/1989 | European Pat. Off. . |
| 0541139 | 5/1993 | European Pat. Off. . |
| 0581556 | 2/1994 | European Pat. Off. . |
| 0586202 | 3/1994 | European Pat. Off. . |
| 0613016 | 8/1994 | European Pat. Off. . |
| 9005322 | 5/1990 | WIPO . |

OTHER PUBLICATIONS

Bahadur, "Liquid Crystals Applications and Uses", World Scientific, vol. 3, pp. 190–193; Dec. 1992.
Henley et al, "A High Speed Flat Panel In-Process Test System for TFT Array Using Electro-Optic Effects", IEICE Trans. Electronics, vol. E76–C, No. 1, Jan. 1993, pp. 64–67.

*Primary Examiner*—Ernest F. Karlsen
*Attorney, Agent, or Firm*—Cushman Darby & Cushman LLP

[57] ABSTRACT

An E-O probe for a two-dimensional voltage detecting apparatus using a fiber optic plate is provided. The fiber optic plate has a bottom face facing a measured object and a bundle of a plurality of cores separated from one another by cladding electro-optic material is attached to an end of each core at said bottom face side. A reflecting surface is provided on the bottom face side of the fiber optic plate for reflecting light back toward the side of the fiber optic plate opposite said bottom face. The refractive index of said electro-optic material varies in response to the intensity of an electric field applied to the electro-optic material. A two-dimentional voltage detecting apparatus using the E-O probe is further provided which has a high spatial resolution.

24 Claims, 13 Drawing Sheets

E-O PROBE WITH FOP AND VOLTAGE DETECTING APPARATUS USING THE E-O PROBE

BACKGROUND OF THE INVENTION

1. Field of the Invention

The present invention relates to a technology of voltage detection utilizing an electro-optic (E-O) material, and particularly to a E-O probe employing an electro-optic material and a fiber optic plate (FOP), and a two-dimensional voltage detecting apparatus using the E-O probe.

2. Related Background Art

In the conventional art, there is known a non-contacting type of two-dimensional voltage distribution detector utilizing an electro-optic modulator. FIG. 14 illustrates an example of the configuration of such an apparatus. This apparatus has an optical system which is arranged in the following manner. Through a lens 130, light from a light source 140 two-dimensionally irradiates an E-O probe 120 placed in the proximity of electrodes 212 on an object to be measured (for example, IC, liquid crystal panel etc.) 210, and reflected light from the E-O probe 120 is taken by a camera 160. A total reflection mirror 124 is formed on a surface of the E-O probe 120 facing the object to be measured 210, and a transparent electrode (ITO) 123 is formed on the other surface and is electrically connected to ground. Interposed therebetween is an electro-optic material 122. The refractive index of the electro-optic material 122 is varied in accordance with the electric field E generated between the electrodes 212 and the transparent electrode (ITO) 123. Furthermore, the refractive index is different at each portion of the electro-optic material 122 in accordance with the strength of the electric field E in that portion.

The circular polarization state of the light from the light source 140 is the same before the light enters the E-O probe 120, but the polarization state of the light reflected by the E-O probe 120 is different because of the difference of the refractive index from portion to portion in the electro-optic material 122. The different polarization states are converted into difficult intensities after the light passes through an analyzer 150. The light is then detected by a camera 160 as a two dimensional image. This image is processed by a computer, such that the voltage applied to the electrodes 212 on the measured object 210 can be displayed on a computer screen 176 and observed as a two dimensional image.

FIG. 15 also shows an example of the configuration of a two-dimensional voltage distribution detector using an electro-optic modulator. In the optical system of this apparatus, a light source 140 for emitting collimated light is used. The collimated light irradiates an E-O probe 120 by a polarizing beam splitter 152, and the intensity of the light reflected by the E-O probe 120 is two-dimensionally detected by a camera 160. Also with this configuration, after the signal from the camera 160 is processed by an imager 172 and an image processor 174, the voltage applied to the measured electrodes 212 on the object 210 is displayed on the computer screen 176, so that a two-dimensional voltage image can be observed.

These apparatus as can be used, for example, to inspect wiring defects and the like in a liquid crystal panel by applying voltage thereto during the manufacturing process after formation of TFTs (thin film transistors) and wiring has been completed. The conventional E-O probe 120 has a configuration shown in FIG. 16 in which an electro-optic material 122 and a reflecting mirror 124 are formed on a glass substrate 125. Another proposed E-O probe is shown in FIG. 17, in which a plurality of elongated electro-optic materials 122 are placed and separated by the electrodes 126. The electrodes 126 are used to generate the electric field E in conjuction with the electrode 212. This configuration makes the two dimensional detection of the voltage distribution easier.

In the two-dimensional voltage distribution detectors as shown in FIGS. 14 and 15, the spatial resolution is inferior and the discrimination between adjacent electrodes is difficult. Particularly, these detectors cannot effectively evaluate ICs where space between electrodes is narrow due to high integration. Moreover, it is difficult to make a large modulator and even if the large modulator was made, the large area could not be measured at once because the optical system of the detector is complicated.

Therefore, there is a great need in the art for; a two-dimensional voltage detecting apparatus having high spatial resolution.

SUMMARY OF THE INVENTION

Accordingly, an object of the present invention is to solve the aforementioned problems, and particularly to provide a E-O probe employing an electro-optic material and a fiber optic plate. A further object is to provide two-dimensional voltage detecting apparatus using the E-O probe.

In accordance with one aspect, an E-O probe according to the present invention comprises a fiber optic plate having a bottom face, comprising a plurality of cores separated from one another by cladding, and an electro-optic material attached to an end of each core at the bottom face side, having a reflecting surface for reflecting light on the side remote from the bottom face, the refractive index of said electro-optic material being variable in response to the intensity of an electric field applied to the electro-optic material.

In accordance with a second aspect, a two-dimensional voltage detecting apparatus according to the present invention comprises an E-O probe as described above, a light source for irradiating the E-O probe, and a photodetector for detecting light emerging from the E-O probe, whereby the photodetector detects light from the E-O probe after the light from the light source irradiates the E-O probe, is guided toward the bottom face by the cores, passes through said electro-optic material, is reflected by the reflecting surface, and comes back to said upper face.

In accordance with a third aspect, the invention is embodied in a two-dimensional voltage detecting apparatus comprising a flexible bundle of a plurality of optical fibers having a first face at one end of the bundle and a second face at another end of the bundle, the bundle being fixed to the fiber optic plate, so that the first face abuts on the E-O probe.

In accordance with a fourth aspect, the invention is embodied in a two-dimensional voltage detecting apparatus, wherein the electro-optic material is arranged uniformly on the bottom face of the FOP.

In accordance with a fifth aspect, the invention is embodied in a two-dimensional voltage detecting apparatus, wherein the electro-optic material is separately arranged at each core.

In accordance with a sixth aspect, the invention is embodied in a two-dimensional voltage detecting apparatus, wherein a conductive material is formed around each electro-optic material, the conductive material being electrically grounded.

In accordance with a seventh aspect, the invention is embodied in a two-dimensional voltage detecting apparatus, wherein the electro-optic material projects with respect to an end face of the cladding of the FOP, or wherein the cores of the FOP project with respect to an end face of the cladding of the FOP.

In accordance with a ninth aspect, the invention is embodied in a two-dimensional voltage detecting apparatus, wherein spaces between the electro-optic materials are filled with reinforcing materials.

In accordance with further aspect, the invention is embodied in a two-dimensional voltage detecting apparatus further comprising a beam splitter.

In accordance with a tenth aspect, the invention is embodied in a two-dimensional voltage detecting apparatus further comprising a flexible bundle of optical fibers, the bundle having a lower face at one end of the bundle, and having the other end with separated fibers, each of the separated fibers being provided with of a plurality of photodetectors.

In the present invention, the refractive index of the electro-optic material of the E-O probe is varied in accordance with the voltage of a predetermined portion of the object to be measured. When the light enters the electro-optic material, the photodetector detects the light as the two dimensional variation of the intensity of the reflected light from the E-O probe. Consequently, the voltage of the predetermined portion of the object is two-dimensionally measured.

Here, the light from the light source is two-dimensionally guided to the electro-optic material through each core of the fiber optic plate, and the light reflected by the electro-optic material located in the proximity of the object to be measured comes back to the respective core of the fiber optic plate and the light emerging from each core is detected as the reflected light from the E-O probe. In other words, the electro-optic material is disposed at each portion corresponding to each core of the fiber optic plate, so that equivalently, an E-O probe is formed at each respective core. Therefore, the voltage of the object can be two-dimensionally measured with high resolution over a large area in accordance with the aperture of the fiber optic plate.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The embodiments of the present invention will be described with reference to the drawings. The description of the same or equivalent parts as in the above-described conventional examples will be briefed or omitted.

Figure 1:
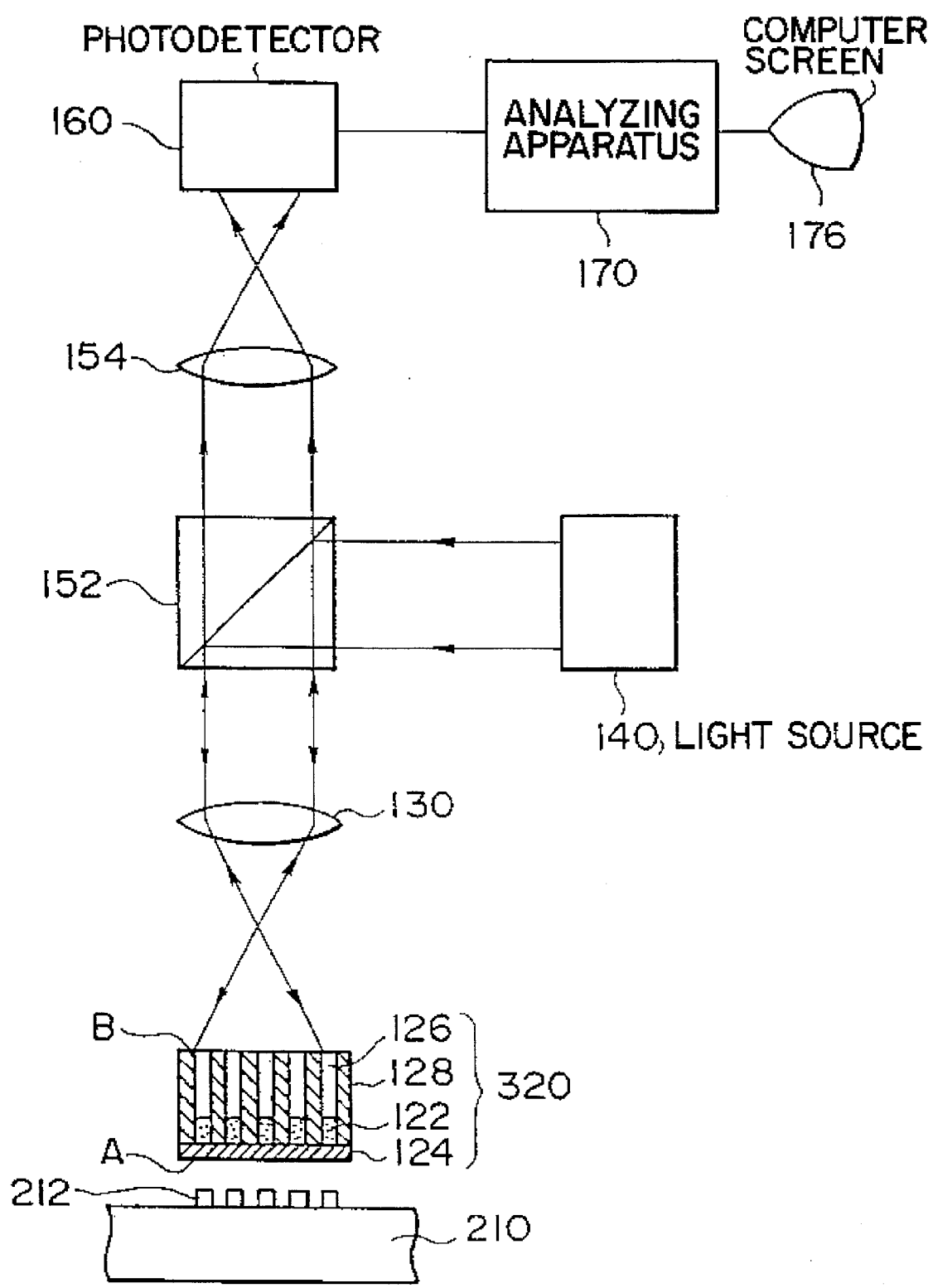
FIG. 1 is a view of the configuration of the embodiment.

FIG. 1 shows an example of the configuration of the two-dimensional voltage detecting apparatus of the present invention. A light source 140 for emitting collimated light to an optical system is used in this apparatus. The collimated light irradiates an E-O probe 320 by a beam splitter 152 through a lens 130. Then, the light reflected by the E-O probe 320 is detected as a two dimensional image by a two-dimensional photodetector 160 through lenses 130, 154. At this point, the intensity of the reflected varies in accordance with the voltage applied to electrodes 212 on measured object 210. After the signal from the two-dimensional photodetector 160 is processed by an analyzing apparatus 170 including an imager and an image processor, the voltage distribution on the measured object 210 is displayed on a computer screen 176 as a two dimensional image, so that the voltage is observed. This is the same as in the above-described conventional examples but in the present invention, a fiber optic plate (126, 128) is used in the E-O probe 320, and an electro-optic material 122 is filled in the cores 126 at the end of the fiber optic plate. The E-O probe 320 is configured such that the electro-optic material 122 is filled in the lower portions of the plurality of cores 126 separated by cladding 128 and such that a reflection film 124 is placed on the bottom surface.

Here, materials used as the electro-optic materials, e.g., LiNbO$_3$, GaAs, ZnTe, liquid crystal etc. have refractive indices which are varied when voltage is applied, such that the polarization state of the incident light is altered. In this case, to convert the altered polarization state into a variation of light intensity, it is desirable to use a polarizing beam splitter as the beam splitter 152 or to add an analyzer added in front of the photodetector 160. Moreover, it is desirable to include polarizer is in the light source 140 to linearly polarize the light emitted from the light source 140. It is also desirable to add a wave plate in the optical path to apply optical bias.

The light modulator with the fiber optic plate such as the E-O probe 320 is, for example, formed in the following way. First, only the lower portion of the ordinary fiber optic plate is soaked in etching solution that selectively etches only cores to remove the parts of the cores located at lower portions of the fiber optic plate. Next, the electro-optic material is deposited in the cores by vapor deposition or sputtering. Here, the thickness of the electro-optic material is basically equal to or less than the diameter of core in the fiber optic plate (FOP) and the maximum thickness is a few times larger than the diameter of a core. To give a rough idea, the suitable thickness is equal to or less than 10 μm. In the case of liquid crystal, the liquid crystal is applied by a spinner or by pumping it up with the osmotic pressure. Finally, the reflecting film, comprising alternating layers of SiO$_2$ and TiO$_2$ for example is formed.

Figure 2:
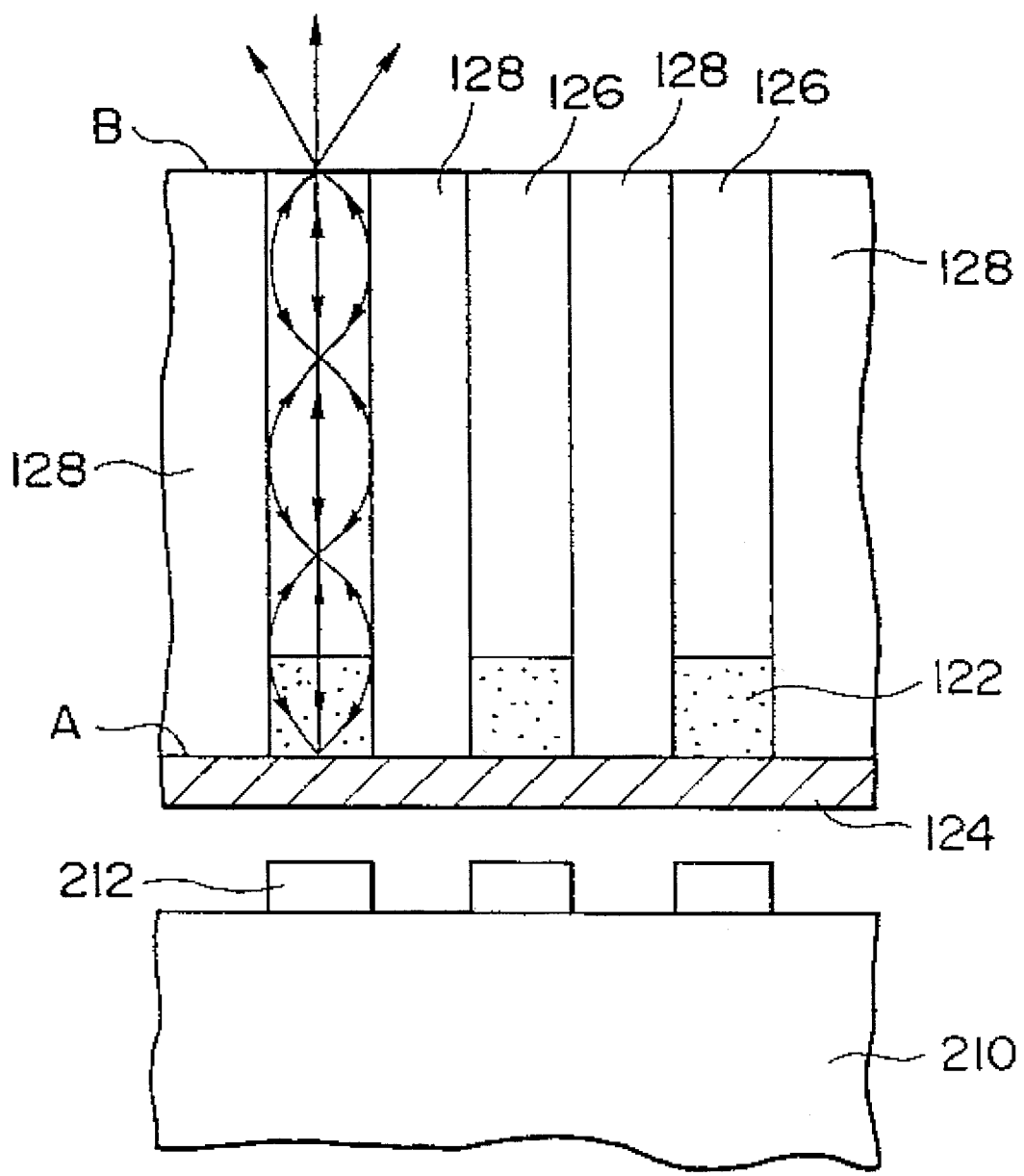
FIG. 2 is an enlarged view showing light confined in a core 126 of an E-O probe 320 and propagating therein.

The fiber optic plate is a bundle of a plurality of optical fibers fused into one block or plate, which can transfer an image on the bottom surface (surface A) of the plate to an upper surface (surface B) to thereby form the image on the upper surface. In other words, light is confined in the core 126 of the E-O probe 320 and propagates therein. FIG. 2 shows its enlarged view.

First, light incident from the light source 140 forms an image (is collected) on the upper surface of the FOP 320 by the lens 130. At this point, the light entering each core travels downward, and it is modulated in the electro-optic material, reflected by the mirror, and comes back to the respective core. Describing in more detail, as shown in FIG. 2, the light incident on the surface B from the light source 140 propagates in each core 126, and it is reflected by the reflection film 124 and comes back to the respective core. At this point, the refractive index of the electro-optic material 122 is varied in accordance with the electric field generated by the voltage applied to the electrodes 212, and the light is modulated by the voltage applied to the electrode of the measured device while the light is traveling back and forth in the electro-optic material 122.

The electro-optic materials 122 are located only at the lower ends of the cores 126 of the fiber optic plate and spatially separated from one another. Further, the light incident on the electro-optic material 122 and the reflected light both propagate in the respective core 126, and the optical paths are separated from one another. Therefore, the light propagating in each core 126 is modulated only by the respective electro-optic material 122 located at the lower end of the core 126 and never mixed with the light modulated by other electro-optic materials 122.

The light modulated by each electro-optic material 122 forms an image on the upper surface (surface B) of the fiber optic plate, and then this image is formed on the detecting surface of the two-dimensional photodetector 160 by the lenses 130, 154. In this manner, the modulated light generated by each electro-optic material 122 is detected by the two-dimensional photodetector. Accordingly, the two-dimensional voltage distribution of the device undertest is measured. Moreover, because the light modulated by each electro-optic material 122 is prevented from being mixed with one another, the influence of the adjacent electrodes is eliminated and the two-dimensional voltage detection is performed with high resolution.

Figure 16:
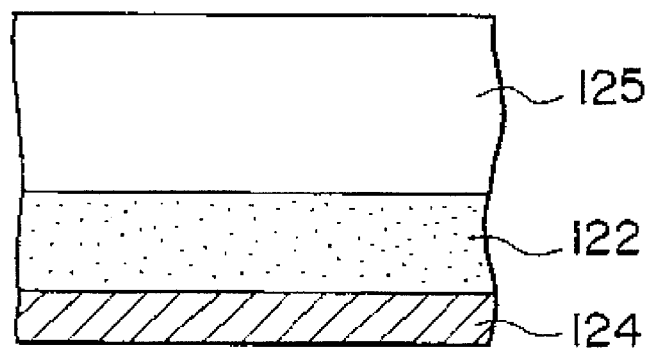
FIG. 16 is a view of the configuration of a conventional E-O probe.

In the E-O probe in which the thin film of electro-optic material is formed on the glass substrate shown in undesirable conventional example (FIG. 16), the reflection occurs at the surface of the glass substrate and at the interface between the surface of the glass substrate and the material. Moreover, light scattering occurs when the light passes through the substrate. These two phenomena produce stray light with respect to the desired light reflected by the mirror, and adversely affect the electro-optic detection. In the E-O probe 320 of the present embodiment on the other hand, the light incident on each electro-optic material 122 and the reflected light both propagate in the respective core 126 of electro-optic material 122 and light in each core is prevented from being mixed together, so that the two-dimensional voltage detection is performed with high spatial resolution.

Figure 17:
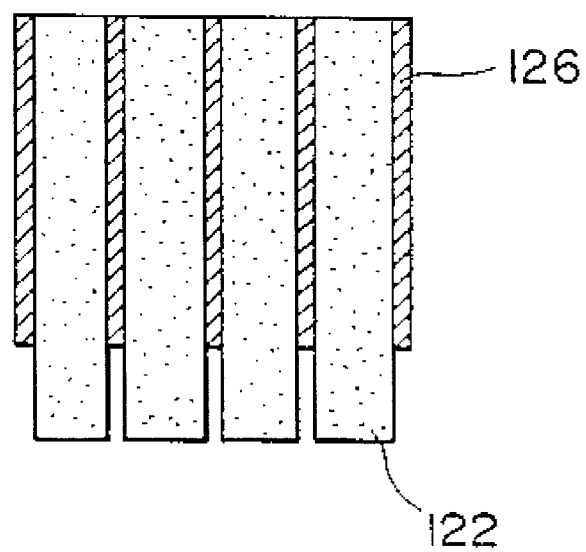
FIG. 17 is a view of the configuration of a conventional E-O probe.

In the E-O probe in which the electro-optic materials are separated from one another by spacers of conductive material (Japanese Patent Laid-Open No. SHOU 64-009370 (009370/1989)), as shown in the conventional example (FIG. 17), since the plurality of the electro-optic materials need to be arranged in a row in order to be processed correctly, it is hard to form the E-O probe accurately. Moreover, for the same reason, it is difficult to increase the number of electro-optic materials and to finely process each. In the E-O probe 320 of the present embodiment, each electro-optic material is finely formed and high spatial resolution is attained using the above-described methods and the method described below.

Accordingly, the two-dimensional voltage detecting apparatus of the present invention two-dimensionally measures the voltage using the electro-optic materials 122, the refractive indices of which are varied in accordance with the electric fields generated by the voltage applied to the electrodes 212, and one of features of the present invention is forming the electro-optic materials 122 in parts of the cores of the fiber optic plate. Therefore, the two-dimensional voltage detecting apparatus of the present invention can measure a large area with high spatial resolution.

Figure 3:
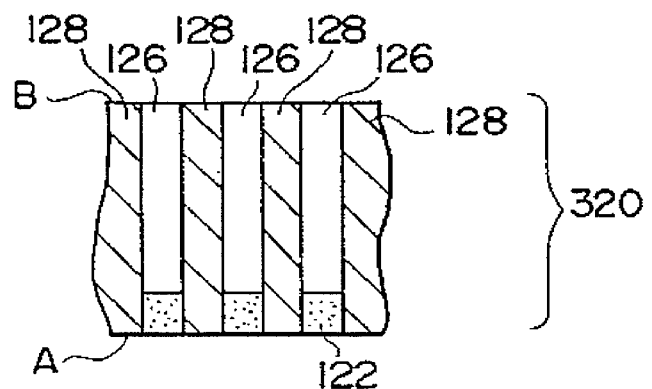
FIG. 3 is a view showing a first example of the configuration of an E-O probe.
Figure 4:
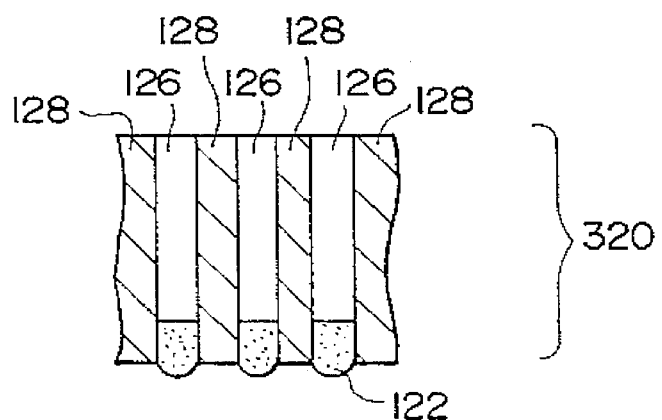
FIG. 4 is a view showing a second example of the configuration of an E-O probe.
Figure 5:
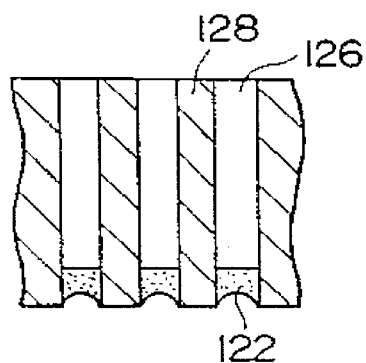
FIG. 5 is a view showing a third example of the configuration of an E-O probe.

The configuration of the E-O probe 320 is not limited to that one shown in FIG. 3. The electro-optic material 122, can be formed to obtain an E-O probe with projecting electro-optic materials 122 as shown in FIG. 4 and an E-O probe with dented electro-optic materials 122 as shown in FIG. 5. Further, the following configuration may be employed.

Figure 6:
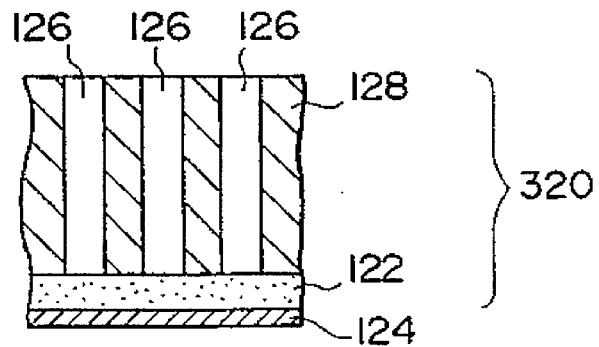
FIG. 6 is a view showing a fourth example of the configuration of an E-O probe.

First, as shown in FIG. 6, a thin film 122 of electro-optic material can be formed on the surface (entire surface of surface A) of the FOP 320. Also in this configuration, the incident light through the lens forms an image on the upper surface (surface B) of the FOP 320. At this point, the light entering each core 126 travels downward and is modulated in the electro-optic material 122. Then, the light reflected at the end of each core 126 among the lights reflected by the mirror comes back to the respective core. Therefore, this configuration is equivalent to the configuration in which the electro-optic materials 122 are formed only at the ends of the cores 126. Accordingly, the thickness of the electro-optic material 122 is basically equal to or less than the diameter of the core 126 of the FOP 320, and the maximum thickness is a few times larger than the diameter of the core. To give a rough idea, the suitable thickness is equal to or less than 10 μm.

Figure 7:
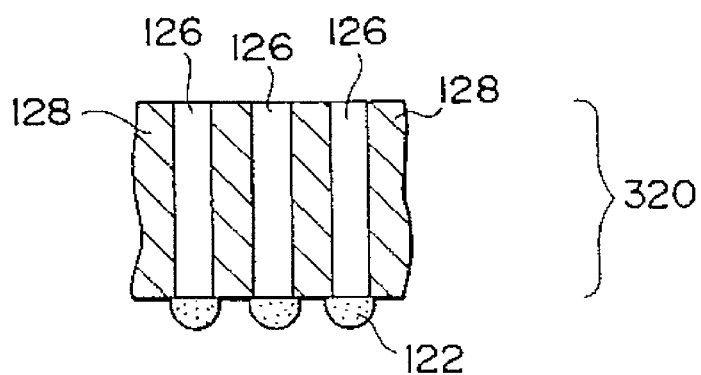
FIG. 7 is a view showing a fifth example of the configuration of an E-O probe.

Next, as shown in FIG. 7, the electro-optic materials can be formed only at the lower ends of the cores of the FOP so as to be separated from one another. This configuration is formed in the following process. The E-O probe is formed so that the thin film 122 of electro-optic material is formed on the surface (entire surface of surface A) of the FOP 320, e.g., by sputtering etc. and thereafter, patterned with a photomask. The electro-optic materials 122 located at the cladding 128 are removed by etching (wet or dry). Alternatively, the configuration shown in FIG. 7 can be obtained in the following process. The resist is applied on the bottom surface (surface A) of the FOP. Thereafter, it is patterned and the core portions 126 are exposed. Next, the electro-optic materials 122 are deposited only on the exposed core portions 126 by vacuum-deposition, sputtering etc. and the resist is removed.

Because the invention works if the light is detected after passing through the electro-optic material 122, the mirror 124 is not always necessary if the incident light to the core 126 is reflected by the electro-optic material 122 itself. This point is the same as in the above-described embodiments and in the embodiments which will be described later.

Figure 8:
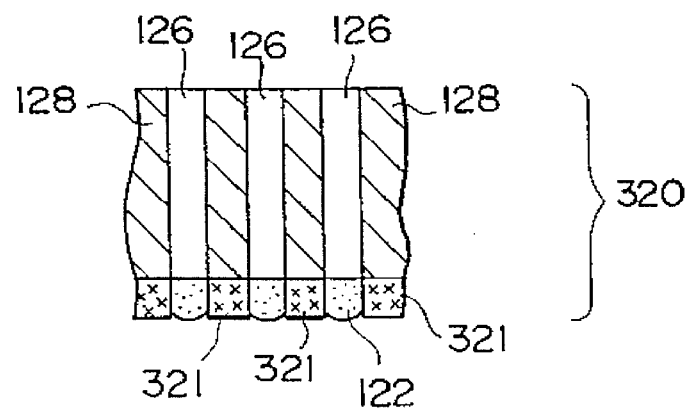
FIG. 8 is a view showing a sixth example of the configuration of an E-O probe.

To improve the mechanical strength, the spaces between the adjacent electro-optic materials 122 of the E-O probe shown in FIG. 7 can be filled with reinforcing materials 321 (FIG. 8). For the reinforcing materials 321 in this configuration, epoxy adhesives can be used. The E-O probe with the configuration shown by FIG. 8 can also be formed in the following method. After the electro-optic material 122 is patterned and etched in the above described processes so that the resist remains on the electro-optic material 122, the glass material 321 is deposited by vacuum deposition. Thereafter, the glass material 321 or the like on the resist is lifted off and removed to leave only the reinforcing materials 321 filling the spaces between the adjacent electro-optic materials.

Figure 18:
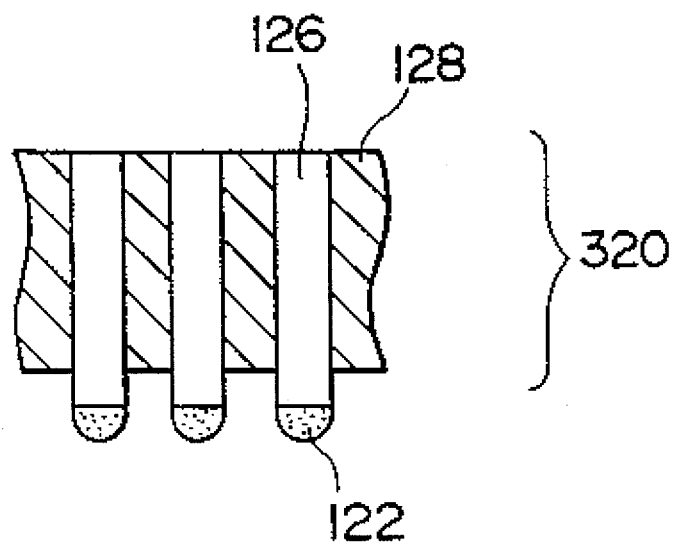
FIG. 18 is a view showing an example of the configuration of an E-O probe.
Figure 19:
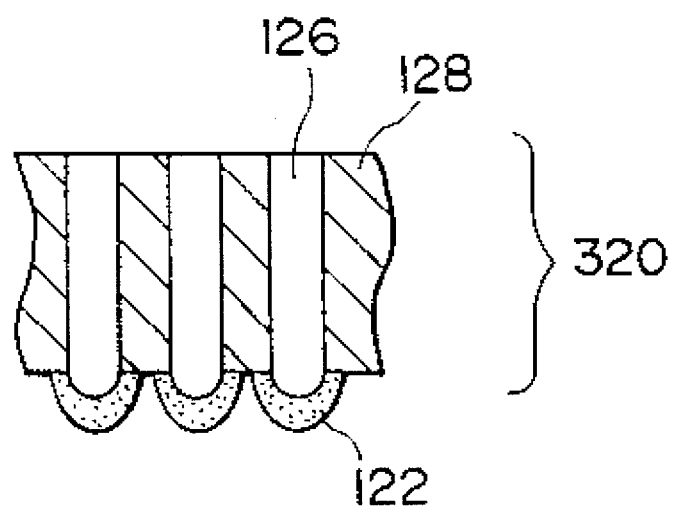
FIG. 19 is a view showing an example of the configuration of an E-O probe.

Further, in an opposite manner to that of the embodiment of FIG. 1, as shown in FIG. 18 and FIG. 19, the cladding 128 on the surface of the FOP is removed so that the cores 126 are exposed and then the electro-optic materials 122 are formed on the exposed cores. Furthermore, as shown in FIG. 20 and FIG. 21, in the same way as that in FIG. 8, the spaces between the adjacent electro-optic materials can be filled with the reinforcing materials 321.

Here, the configuration as shown in FIG. 18 can be formed, e.g., in the following manner. First, an electro-optic material is uniformly formed by vapor deposition on a fiber optic plate. Then, only the bottom part of the fiber optic plate is dipped in an etching liquid which selectively etches only the cladding to remove the cladding at the lower part of the fiber optic plate. During this process, because the electro-optic material is thin, although the cladding is covered with electro-optic material, the etching liquid soaks into the cladding to etch it, and the electro-optic material is removed together with the cladding. This process is the same as that referred to as lift-off in a semiconductor IC manufacturing process.

The configuration as shown in FIG. 19 can be formed, e.g., in the following manner. First, the cladding is etched in the same way as that in FIG. 18. Then, resist is applied on the entire face. It is patterned so as to leave the resist only at the middle part of the cladding. Electro-optic material is formed thereon by vacuum vapor deposition, and then the electro-optic material on the resist is removed by lift-off to form the configuration shown in FIG. 19.

Figure 20:
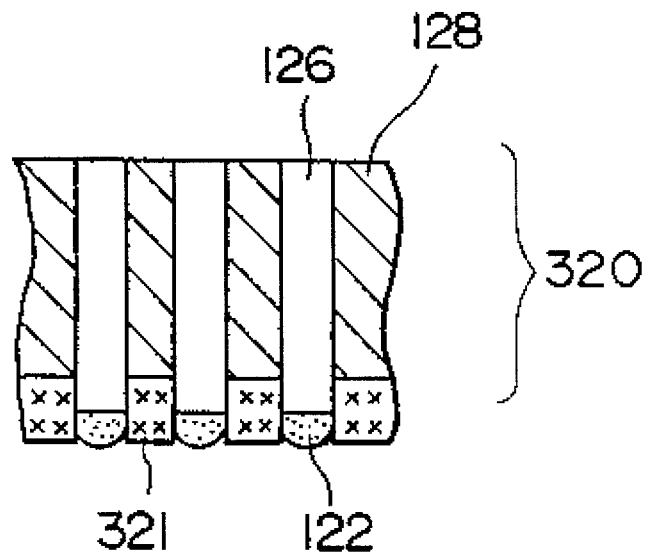
FIG. 20 is a view showing an example of the configuration of an E-O probe.
Figure 21:
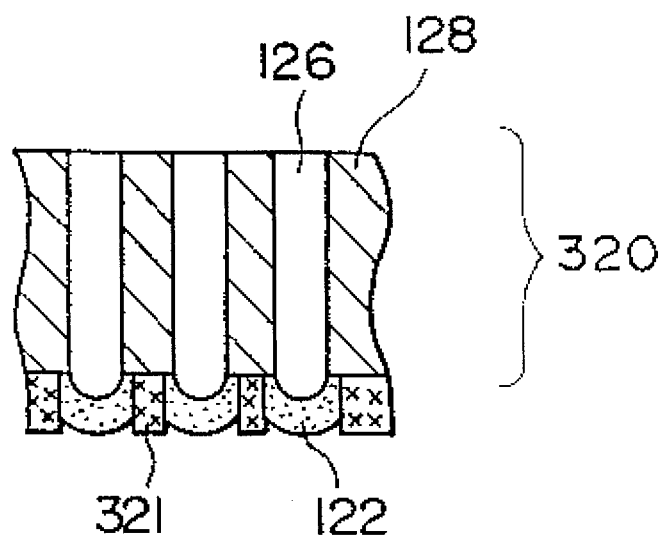
FIG. 21 is a view showing an example of the configuration of an E-O probe.

The reinforcing material shown in FIGS. 20 and 21 is formed in the same way as that in FIG. 8.

The configurations as in FIGS. 18, 19, 20 and 21, improve detection sensitivity because no cladding is around the electro-optic material such that an electric field is effectively applied to the material. Additionally, spatial resolution is further improved because adjacent electrodes have less affect on one another.

Figure 9A:
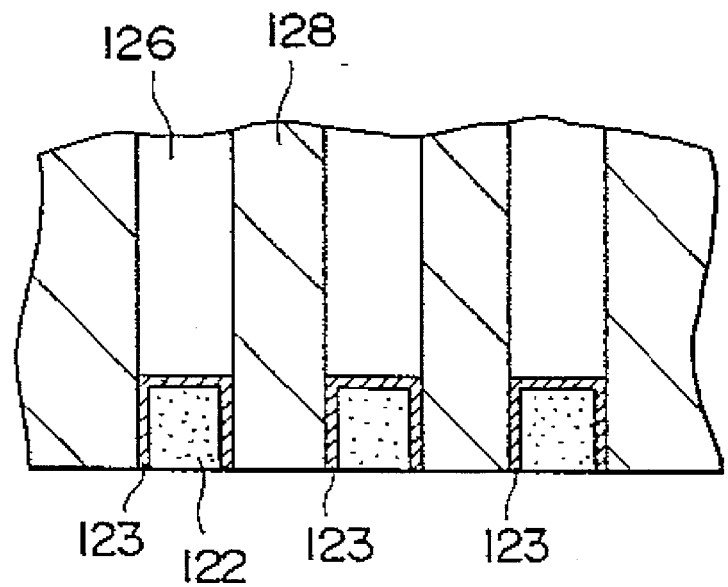
FIGS. 9A and 9B are views showing a seventh example of the configuration of an E-O probe.

In the conventional manner, the back plate electrode 123 is formed on the interface between the FOP and the electro-optic material, and this back plate electrode 123 is grounded. This point is the same in the above-described embodiment and in the embodiment which will be described later. FIG. 9A shows an E-O probe in which the back plate electrode 123 is formed around the electro-optic materials 122 (not only the upper surface but also the side surface) in the E-O probe shown in FIG. 3. Because the back plate electrode 123 is grounded, the electric field is generated between the back plate electrode 123 and the electrodes 212 of the object 210 to be measured. Consequently, the electrical separation of the electro-optic materials 122 is enhanced, which increases the detection resolution. The back plate electrode 123 is formed by depositing a conductive material such as a metal film on the inner wall of each core 126 before the electro-optic materials 122 are formed on the cores 126 of the fiber optic plate.

Figure 9B:
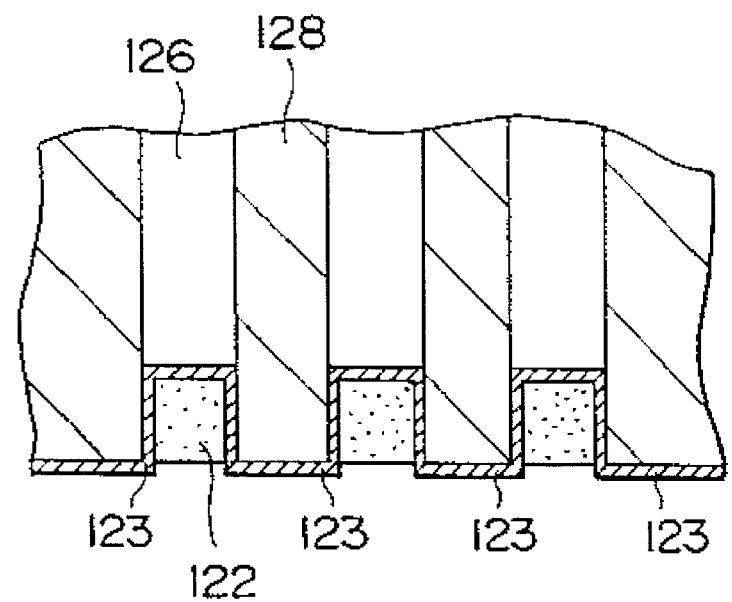

To ground the back plate electrode, as shown in FIG. 9B, the back plate electrode is also formed on the bottom surface of each cladding 128 of the fiber optic plate, and all these electrodes are connected together and grounded.

Figure 10:
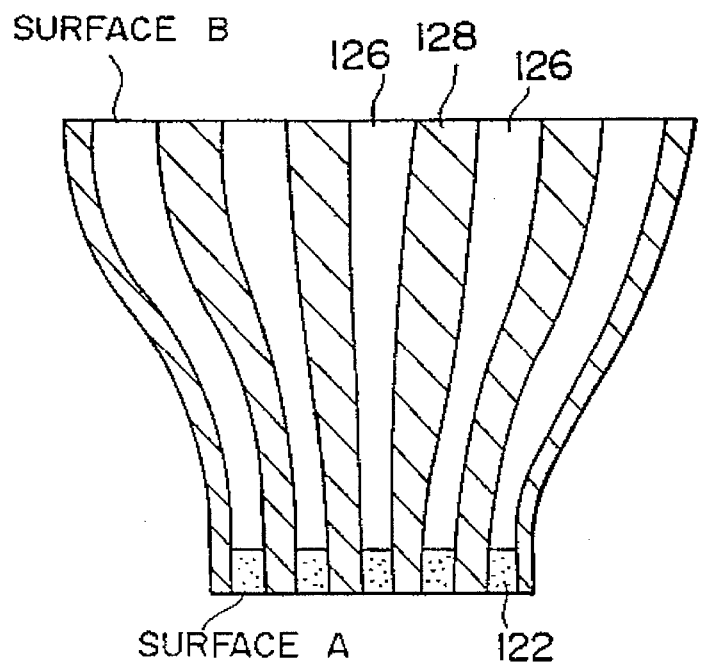
FIG. 10 is a view showing an eighth example of the configuration of an E-O probe.
Figure 11:
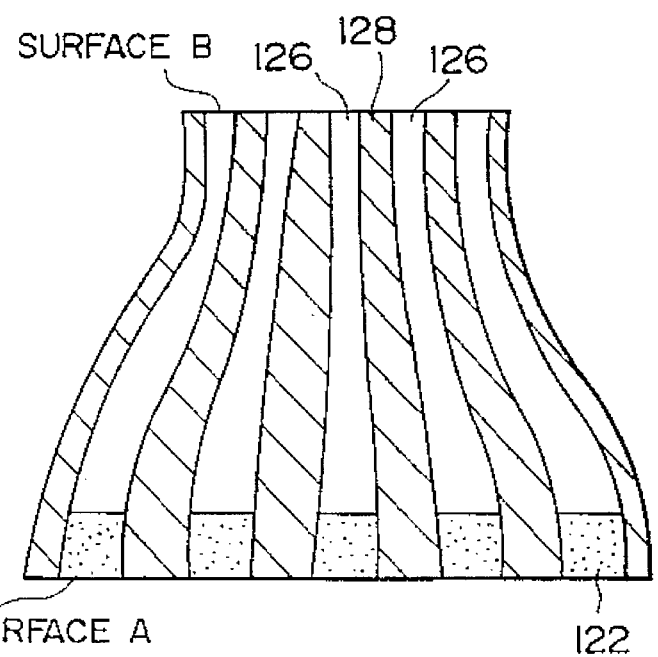
FIG. 11 is a view showing a tenth example of the configuration of an E-O probe.

The area of the surface A is typically equal to the area of the surface B in the fiber optic plate but the areas of the surface A and the surface B can readily be made different from each other. For example, the area of the surface A or the surface B can be made smaller by drawing during heating. The ratio of the area of the surface A to the area of the surface B can be arbitrarily set. The FOP constituting the E-O probe 320 may be, as shown in FIG. 10, a shrunk type tapered FOP in which the surface A is smaller than the surface B. On the contrary, as shown in FIG. 11, the FOP may be an enlarged type tapered FOP in which the surface B is smaller than the surface A. In either case, the electro-optic materials 122 are formed in the same way as described above. The reflection film 124 can be further formed. If the E-O probe 320 employing one of these fiber optic plates is replaced with the E-O probe 320 in FIG. 1, the two-dimensional voltage distribution in either the very small area or the large area can be measured without changing the light source 140, the photodetector 160 etc.

For example, for semiconductor ICs or LSI devices in which each element is finely formed, the E-O probe 320 as shown in FIG. 10 is used. In this case, the enlarged image on the surface A is formed on the surface B in accordance with the ratio of the area of the surface A to the area of the surface B. Then, the surface A opposite to the device undertest 210 is very small and the electro-optic materials 122 are separated from one another by the cladding 128, so that the high spatial resolution can readily be attained utilizing the light emerging from the enlarged image on the surface B.

Further, when a large device 210 such as a liquid crystal display panel is measured at once, an E-O probe 320 such as the light modulator shown in FIG. 11 can be used. In this case, the shrunken image on the surface A is formed on the surface B in accordance with the ratio of the area of the surface A to the area of the surface B. Each electro-optic material 122 is larger than the one in the case of FIG. 1, so that one pixel is also larger; however, the relative resolution is not changed because the size of each element in the device to be measured is also larger. Consequently, it does not cause any problems. In general, for the conventional light modulator, because it is hard to form the electro-optic material uniformly over a large area, a large E-O probe is difficult to obtain. However, in the case of the light modulator with the fiber optic plate of the present invention, it is apparent from the above-described process that the modulator is readily formed because the electro-optic materials 122 are located only in the cores 126.

Figure 14:
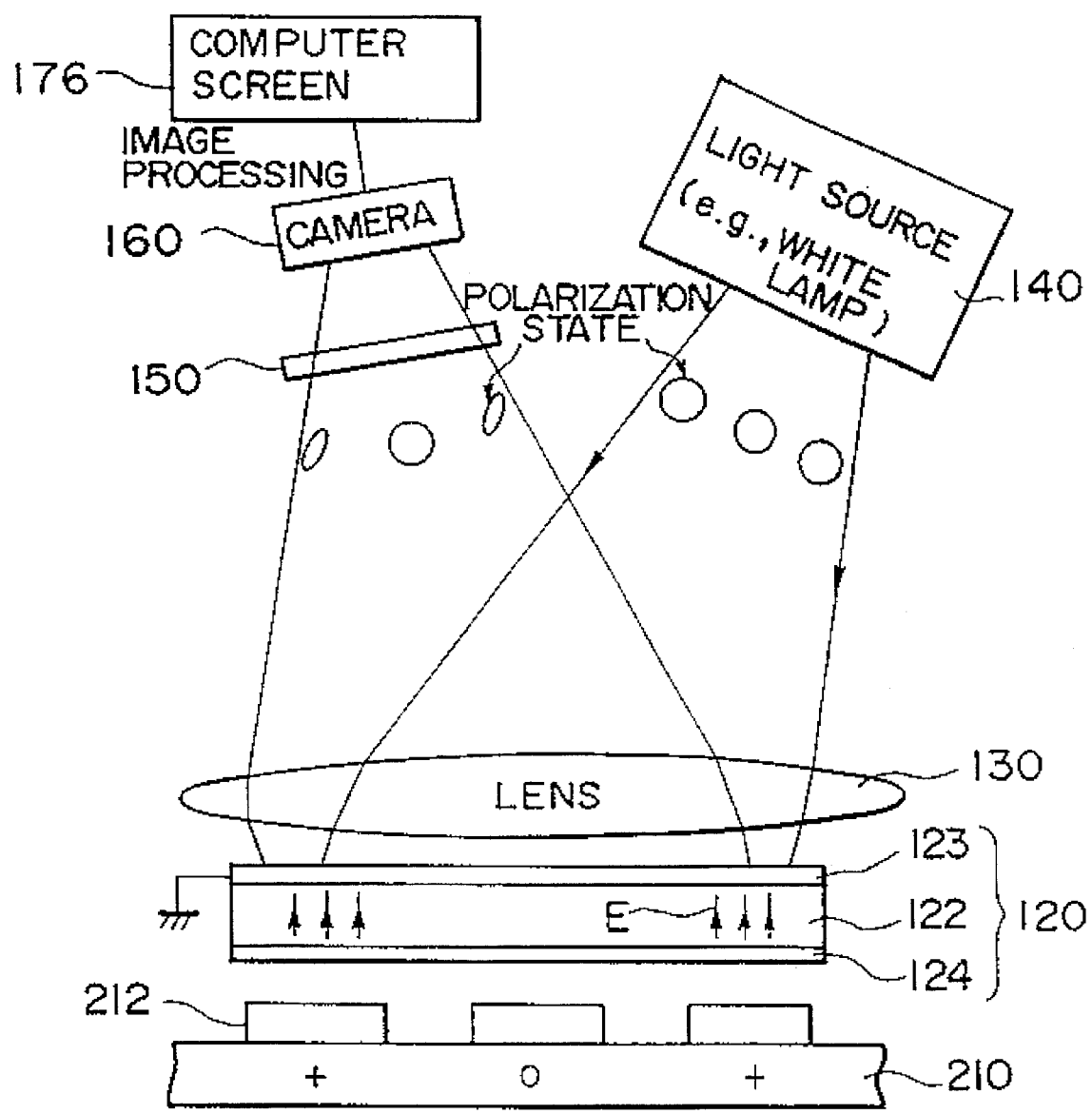
FIG. 14 is a view of the conventional configuration.
Figure 15:
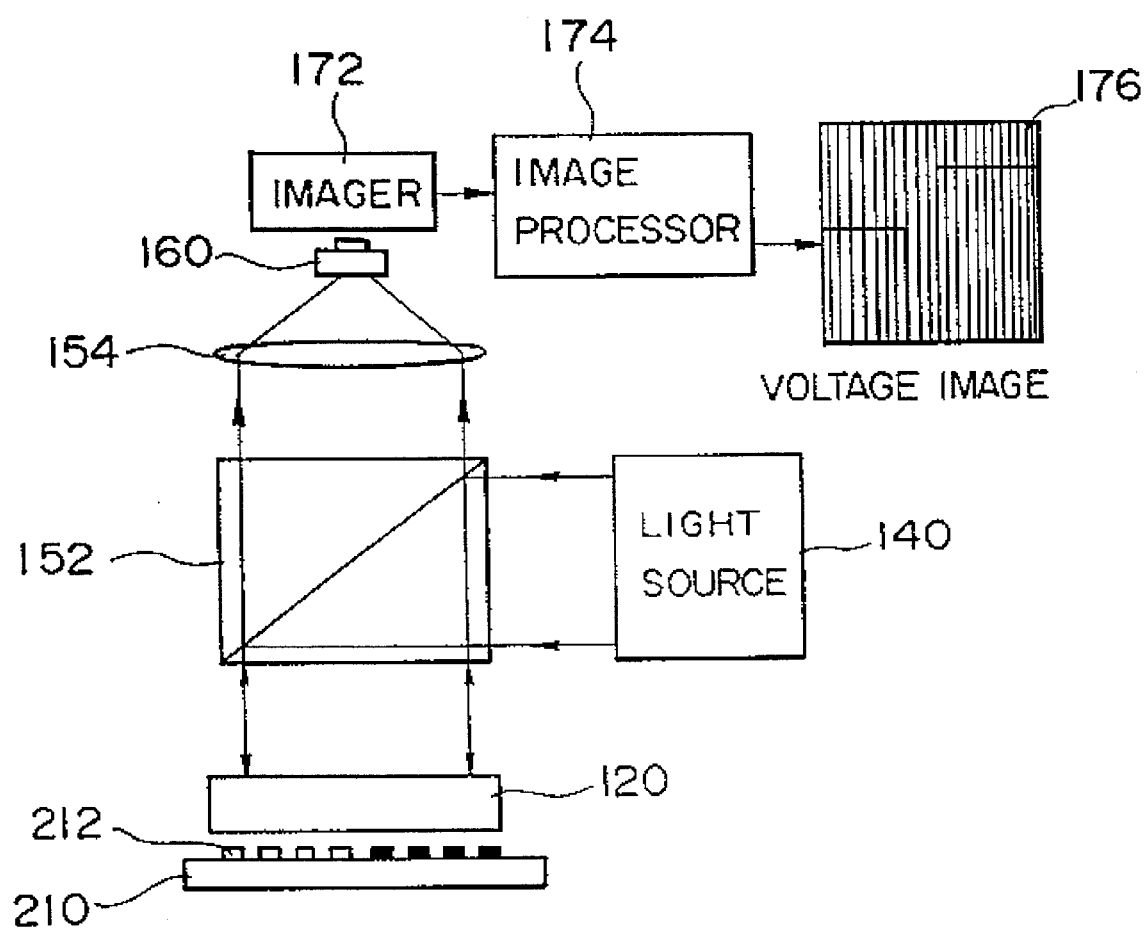
FIG. 15 is a view of the conventional configuration.

Furthermore, the optical system can be modified in various ways. The embodiment in which the lenses 130, 154 are used to form the image on the surface B of the E-O probe 320 onto the photodetector 160 is shown in FIG. 1, but for example, the optical system can be constituted with one lens as shown in the conventional example (FIG. 14).

Figure 12:
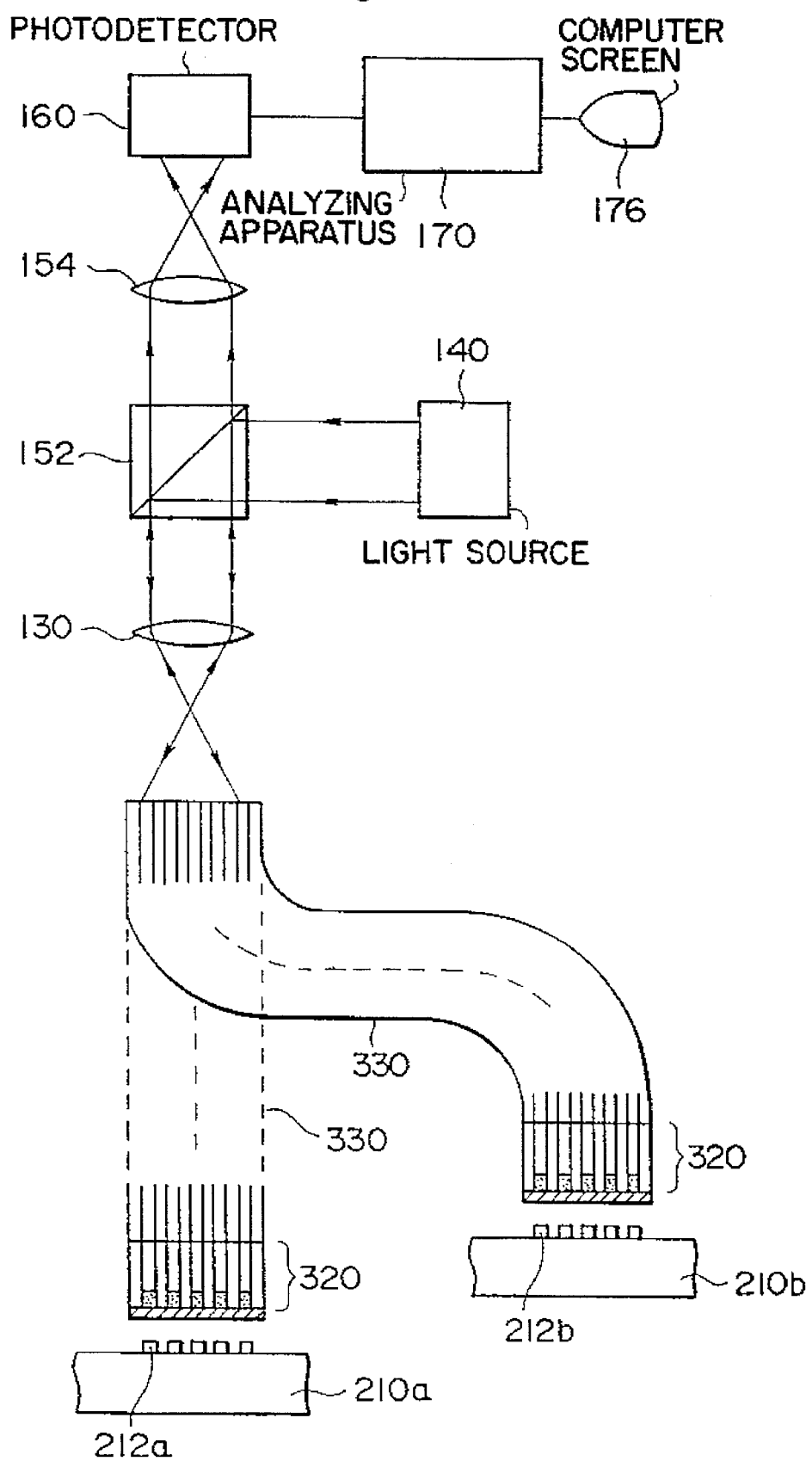
FIG. 12 is a view showing an example of the configuration with the use of a fibre bundle 330.

FIG. 12 shows the configuration of the optical system in which a part of optical path is replaced with a fiber bundle 330. The fiber bundle 330 is a bundle of a plurality of fibers which is easily bent. Accordingly, when the device 210a to be measured and the device 210b to be measured are alternately measured, the fiber bundle 330 is bent to move the light modulator 320 attached at the end of the fiber bundle 330 while the light source 140, the lenses 130, 154, the beam splitter 152, and the photodetector 160 are fixed.

Figure 13:
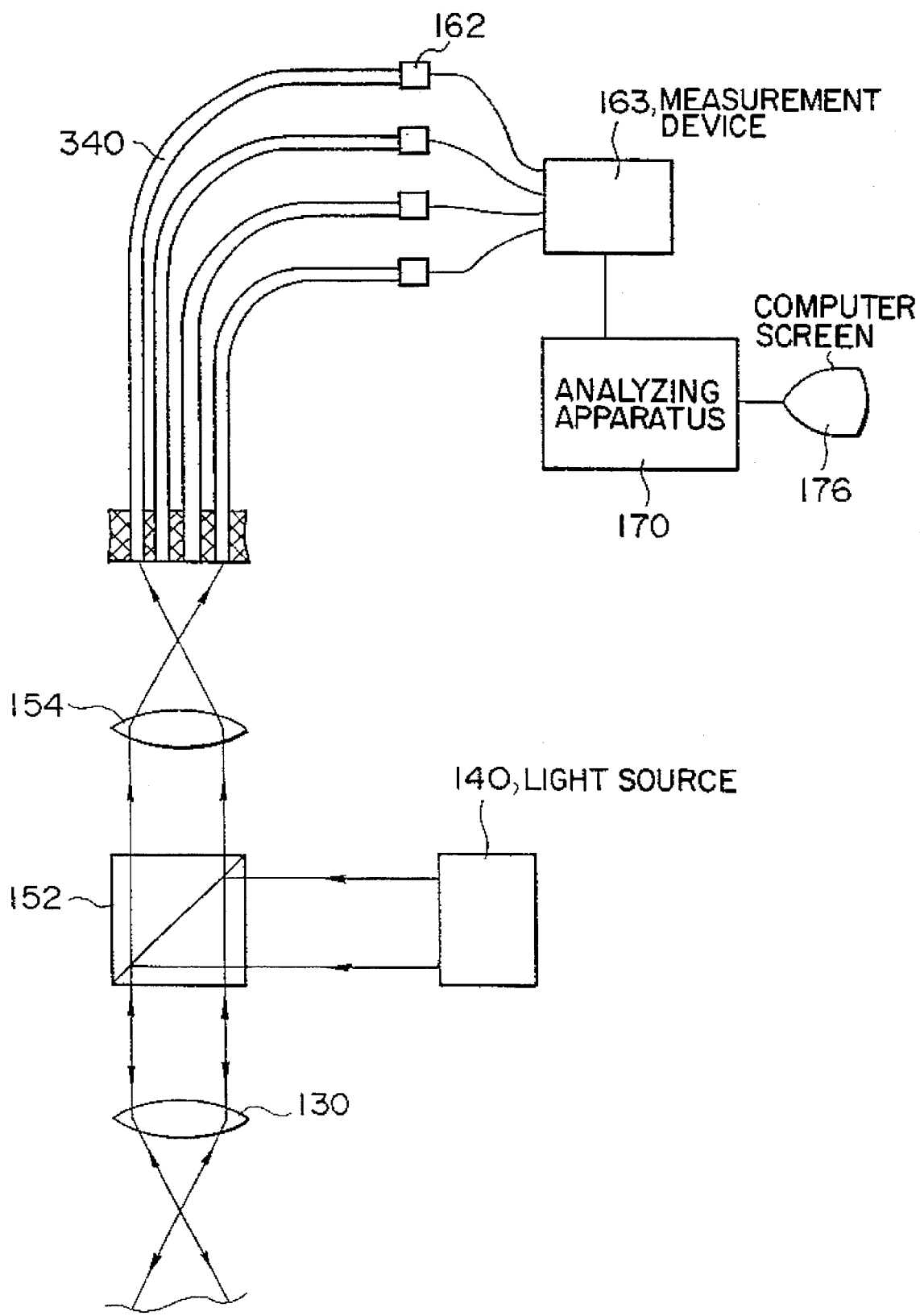
FIG. 13 is a view showing an example of the configuration with the use of a fibre bundle 330.

FIG. 13 shows the configuration of the optical system in which the two-dimensional photodetector 160 in FIG. 1 is replaced with a plurality of photodetectors 162 arranged corresponding to a plurality of optical fibers 340. In this case, devices having high speed response, such as PIN photodiodes for example can be used as the photodetector 162, and if a high speed device is used as a measurement device 163, the real-time variation in the two-dimensional voltage distribution can be detected.

When the refractive index of the electro-optic material 122 is higher than that of the cladding 128, the whole core may be made of electro-optic material 122.

Thus, as described above, according to the present invention, the light from the light source is two-dimensionally guided to the electro-optic materials through each core of the fiber optic plate. Light reflected by the electro-optic materials located near the object to be measured comes back to the respective core of the fiber optic plate. The light emerging from each core is detected as the reflected light from the E-O probe. Therefore, the voltage of the object is two-dimensionally measured over a large area with high resolution in accordance with the aperture of the fiber optic plate.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application Nos. 1622/1994 filed on Jan. 12, 1994 and 300942/1994 filed on Dec. 5, 1994 are hereby incorporated by reference.

What is claimed is:

1. An E-O probe comprising:
   a fiber optic plate having an upper face and a bottom face, comprising a bundle of a plurality of optical fibers fused into one block such that each optical fiber forms an optical path between said upper face and said bottom face, each of said optical fibers including a core and a cladding, said core surrounded by said cladding, and each core separated from the other cores by the cladding;
   an electro-optic material attached to an end of each core at said bottom face side, a refractive index of said electro-optic material varying in response to an intensity of an electric field applied to said electro-optic material; and
   a reflecting surface formed on said bottom face of said fiber optic plate such that said electro-optic material is sandwiched between said cores and said reflecting surface.

2. A two-dimensional voltage detecting apparatus comprising:
   an E-O probe comprising
      a fiber optic plate having an upper face and a bottom face, comprising a bundle of a plurality of optical fibers fused into one block such that each optical fiber forms an optical path between said upper face and said bottom face, each of said optical fibers including a core and a cladding, said core surrounded by said cladding, and each core separated from the other cores by the cladding;
      an electro-optic material attached to an end of each core at said bottom face side, a refractive index of said electro-optic material varying in response to an intensity of an electric field applied to said electro-optic material; and
      a reflecting surface formed on said bottom face of said fiber optic plate such that said electro-optic material is sandwiched between said cores and said reflecting surface.
   a light source for irradiating said upper face with light; and
   a photodetector for detecting light emerging from said upper face;
   whereby said photodetector detects light emerging from said upper face after the light from said light source irradiates said upper face, is guided towards said bottom face by said cores, passes through said electro-optic material, is reflected by said reflecting surface, and comes back to said upper face.

3. A two-dimensional voltage detecting apparatus according to claim 2, wherein said electro-optic material is arranged uniformly on said bottom face.

4. A two-dimensional voltage detecting apparatus according to claim 2, wherein said electro-optic material is separately arranged at each core.

5. A two-dimensional voltage detecting apparatus according to claim 4, wherein said E-O probe further comprises a conductive material formed around each said electro-optic material, said conductive material being electrically grounded, such that said electro-optic material separately attached at each core is physically and electrically isolated.

6. A two-dimensional voltage detecting apparatus according to claim 4, wherein portions of said electro-optic material of said E-O probe project outwardly from said bottom face of said fiber optic plate.

7. A two-dimensional voltage detecting apparatus according to claim 6, wherein portions of said cores of said E-O probe project outwardly from said bottom face of said fiber optic plate.

8. A two-dimensional voltage detecting apparatus according to claim 6, wherein spaces between said portions of electro-optic material projecting outwardly from said bottom face of said fiber optic plate are filled with reinforcing materials.

9. A two-dimensional voltage detecting apparatus according to claim 2, further comprising a beam splitter, said beam splitter being provided across an optical path formed between said upper face of said fiber optic plate and said photodetector and across an optical axis of said light source, wherein light emitted from said light source passes through said beam splitter and irradiates said upper face and wherein light emerging from said upper face passes through said beam splitter and reaches said photodetector.

10. A two-dimensional voltage detecting apparatus comprising:
an E-O probe comprising
a fiber optic plate having an upper face and a bottom face, comprising a rigid bundle of a plurality of optical fibers fused into one block such that each optical fiber forms an optical path between said upper face and said bottom face, each of said optical fibers including a core and a cladding, said core surrounded by said cladding, and each core separated from the other cores by the cladding;
an electro-optic material attached to an end of each core at said bottom face side, a refractive index of said electro-optic material varying in response to an intensity of an electric field applied to said electro-optic material; and
a reflecting surface formed on said bottom face of said fiber optic plate such that said electro-optic material is sandwiched between said cores and said reflecting surface;
a flexible bundle of a plurality of optical fibers, said flexible bundle having a first face at one end of the bundle and a second face at another end of the bundle, each optical fiber forming a substantially parallel optical path between said first face and said second face, said flexible bundle being fixed to said fiber optic plate, so that said first face of said flexible bundle abuts on said upper face of said fiber optic plate;
a light source for irradiating said second face with light; and
a photodetector for detecting light emerging from said second face;
whereby said photodetector detects light emerging from said second face of said flexible bundle after the light from said light source irradiates said second face, is guided towards said first face through said optical fibers of said flexible bundle, then is guided towards said bottom face of said fiber optic plate by said cores of said fiber optic plate, passes through said electro-optic material, is reflected by said reflecting surface, and comes back to said second face via said cores of said fiber optic plate and then via said optical fibers of said flexible bundle.

11. A two-dimensional voltage detecting apparatus according to claim 10, wherein said electro-optic material is arranged uniformly on said bottom face.

12. A two-dimensional voltage detecting apparatus according to claim 10, wherein said electro-optic material is separately arranged at each core of said fiber optic plate.

13. A two-dimensional voltage detecting apparatus according to claim 12, wherein said E-O probe further comprises a conductive material formed around each said electro-optic material, said conductive material being electrically grounded, such that said electro-optic material separately attached at each core is physically and electrically isolated.

14. A two-dimensional voltage detecting apparatus according to claim 12, wherein portions of said electro-optic material of said E-O probe project outwardly from said bottom face of said fiber optic plate.

15. A two-dimensional voltage detecting apparatus according to claim 14, wherein portions of said cores of said E-O probe project outwardly from said bottom face of said fiber optic plate.

16. A two-dimensional voltage detecting apparatus according to claim 14, wherein spaces between said portions of electro-optic material projecting outwardly from said bottom face of said fiber optic plate are filled with reinforcing materials.

17. A two-dimensional voltage detecting apparatus according to claim 10, further comprising a beam splitter, said beam splitter being provided across an optical path formed between said second face of said flexible bundle and said photodetector and across an optical axis of said light source, wherein light emitted from said light source passes through said beam splitter and irradiates said second face and wherein light emerging from said second face passes through said beam splitter and reaches said photodetector.

18. A two-dimensional voltage detecting apparatus comprising:
an E-O probe comprising
a fiber optic plate having an upper face and a bottom face, comprising a rigid bundle of a plurality of optical fibers fused into one block such that each optical fiber forms an optical path between said upper face and said bottom face, each of said optical fibers including a core and a cladding, said core surrounded by said cladding, and each core separated from the other cores by the cladding,
an electro-optic material attached to an end of each core at said bottom face side, a refractive index of said electro-optic material varying in response to an intensity of an electric field applied to said electro-optic material, and
a reflecting surface formed on said bottom face of said fiber optic plate such that said electro-optic material is sandwiched between said cores and said reflecting surface;
a light source for irradiating said upper face with light;
a plurality of photodetectors for detecting light emerging from said upper face; and
a flexible bundle of optical fibers, said flexible bundle having a lower face at one end of the bundle, said lower face being disposed in an optical path of light emerging from said upper face of said fiber optic plate, said flexible bundle having the other end with separated fibers, each of said separated fibers being separately connected with each of the plurality of said photodetectors;
whereby said photodetectors detect light emerging from said upper face after the light from said light source irradiates said upper face, is guided towards said bottom face by said cores, passes through said electro-optic material, is reflected by said reflecting surface, comes back to said upper face, and is guided from said lower face of said flexible bundle to said photodetectors by said separated fibers.

19. A two-dimensional voltage detecting apparatus according to claim 4, wherein said electro-optic material of said E-O probe is attached to each of said cores in cavities surrounded by said cladding, such that said electro-optic material sinks inwardly from said bottom face of said fiber optic plate.

20. A two-dimensional voltage detecting apparatus according to claim 19, wherein said E-O probe further comprises a conductive material formed around each said electro-optic material, said conductive material being electrically grounded, such that said electro-optic material separately attached at each core is physically and electrically isolated.

21. A two-dimensional voltage detecting apparatus according to claim 12, wherein said electro-optic material of said E-O probe is attached to each of said cores in cavities surrounded by said cladding, such that said electro-optic material sinks inwardly from said bottom face of said fiber optic plate.

22. A two-dimensional voltage detecting apparatus according to claim 21, wherein said E-O probe further comprises a conductive material formed around each said electro-optic material, said conductive material being electrically grounded, such that said electro-optic material separately attached at each core is physically and electrically isolated.

23. A two-dimensional voltage detecting apparatus according to claim 2, wherein said fiber optic plate has a shrunk tapered form such that said upper face is smaller than said bottom face.

24. A two-dimensional voltage detecting apparatus according to claim 2, wherein said fiber optic plate has a shrunk tapered form such that said upper face is larger than said bottom face.

* * * * *